United States Patent
Hsu

(10) Patent No.: US 11,342,378 B2
(45) Date of Patent: May 24, 2022

(54) MAGNETIC TUNNEL JUNCTION DEVICE WITH RESIDUE-PROTECTION SIDEWALL SPACER AND THE METHOD FOR FORMING A MAGNETIC TUNNEL JUNCTION DEVICE WITH RESIDUE-PROTECTION SIDEWALL SPACER

(71) Applicant: TAIWAN SEMICONDUCTOR MANUFACTURING COMPANY LTD., Hsinchu (TW)

(72) Inventor: Chern-Yow Hsu, Hsin-Chu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 2 days.

(21) Appl. No.: 16/394,837

(22) Filed: Apr. 25, 2019

(65) Prior Publication Data

US 2020/0343299 A1  Oct. 29, 2020

(51) Int. Cl.
 *H01L 27/22* (2006.01)
 *H01L 43/02* (2006.01)
 *H01L 43/08* (2006.01)
 *H01L 43/12* (2006.01)

(52) U.S. Cl.
 CPC ............ *H01L 27/228* (2013.01); *H01L 43/02* (2013.01); *H01L 43/08* (2013.01); *H01L 43/12* (2013.01)

(58) Field of Classification Search
 CPC ..... H01L 27/222–228; H01L 43/02–12; G11C 11/161; G11C 2211/5615
 See application file for complete search history.

(56) References Cited

U.S. PATENT DOCUMENTS

| | | | |
|---|---|---|---|
| 10,468,585 B1* | 11/2019 | Nguyen ................. | H01L 27/222 |
| 10,707,413 B1* | 7/2020 | Dutta ..................... | G11C 11/161 |
| 2008/0211055 A1* | 9/2008 | Assefa ................... | H01L 43/12 257/506 |
| 2015/0287910 A1* | 10/2015 | Lu .......................... | H01L 43/02 257/421 |
| 2016/0072045 A1* | 3/2016 | Kanaya .................. | H01L 43/08 257/427 |
| 2016/0072055 A1* | 3/2016 | Seto ........................ | H01L 43/12 438/3 |
| 2017/0069832 A1* | 3/2017 | Kim ....................... | H01L 43/08 |
| 2018/0366638 A1* | 12/2018 | Lin ......................... | H01L 43/12 |

* cited by examiner

*Primary Examiner* — Nelson Garces
(74) *Attorney, Agent, or Firm* — WPAT, P.C., Intellectual Property Attorneys; Anthony King

(57) ABSTRACT

The present disclosure provides a semiconductor structure, including a magnetic tunneling junction (MTJ), a top electrode over a top surface of the MTJ, a first dielectric layer surrounding the top electrode, wherein a bottom surface of the first dielectric contacts with a top surface of the MTJ, and a second dielectric layer surrounding the first dielectric layer and the MTJ.

20 Claims, 15 Drawing Sheets

MAGNETIC TUNNEL JUNCTION DEVICE WITH RESIDUE-PROTECTION SIDEWALL SPACER AND THE METHOD FOR FORMING A MAGNETIC TUNNEL JUNCTION DEVICE WITH RESIDUE-PROTECTION SIDEWALL SPACER

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device.

MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer. Pinned layer has a fixed magnetization direction. When current flows in the direction from free layer to pinned layer, electrons flow in a reverse direction, that is, from pinned layer to free layer. The electrons are polarized to the same magnetization direction of pinned layer after passing pinned layer; flowing through tunnel layer; and then into and accumulating in free layer. Eventually, the magnetization of free layer is parallel to that of pinned layer, and MTJ device will be at a low resistance state. The electron injection caused by current is referred to as a major injection.

When current flowing from pinned layer to free layer is applied, electrons flow in the direction from free layer to pinned layer. The electrons having the same polarization as the magnetization direction of pinned layer are able to flow through tunnel layer and into pinned layer. Conversely, electrons with polarization differing from the magnetization of pinned layer will be reflected (blocked) by pinned layer and will accumulate in free layer. Eventually, magnetization of free layer becomes anti-parallel to that of pinned layer, and MTJ device will be at a high resistance state. The respective electron injection caused by current is referred to as a minor injection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
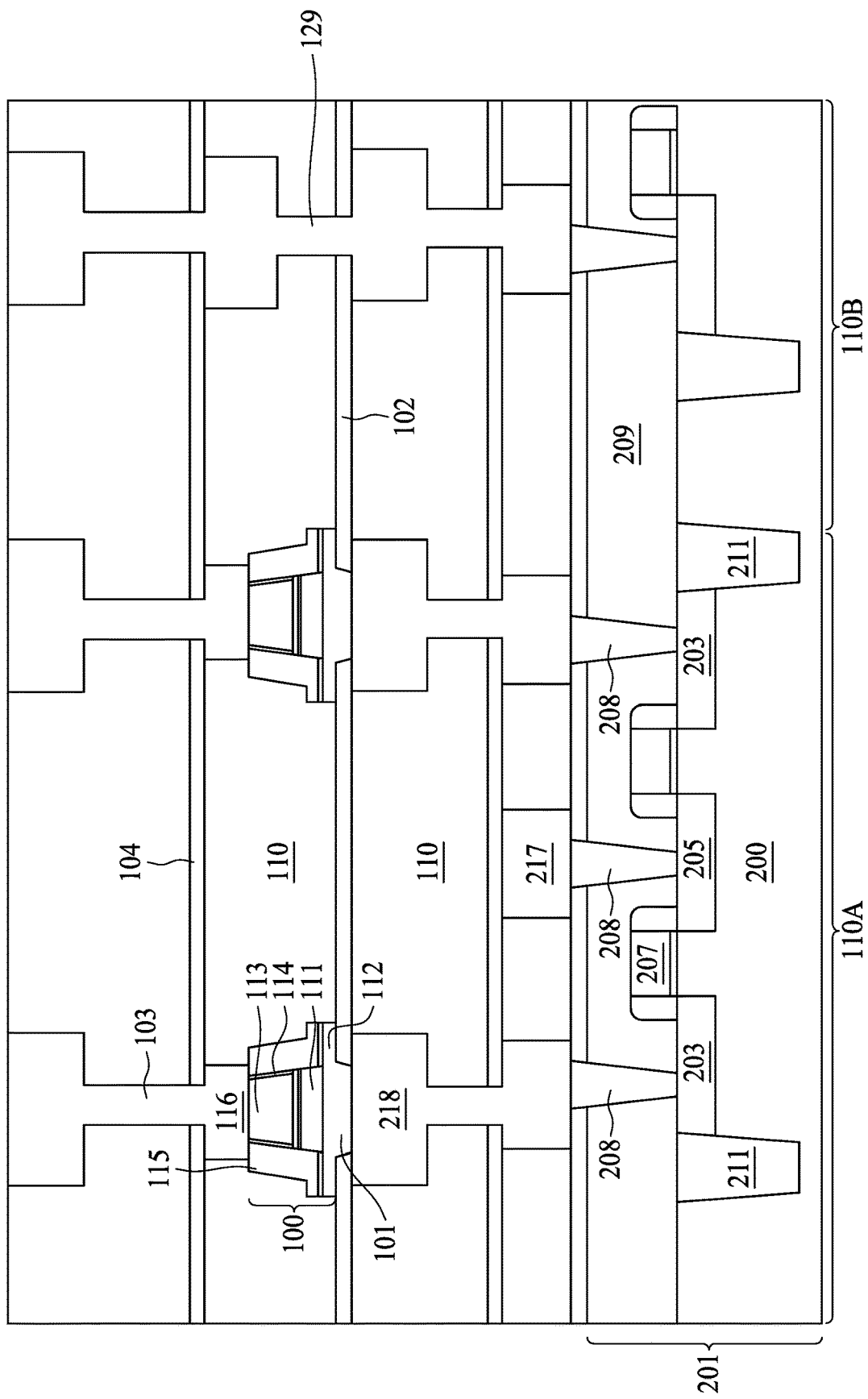
FIG. 1 is a cross sectional view of a semiconductor structure, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

During the operations of forming a magnetic semiconductor structure, for example, a magnetic memory structure or a magnetic tunneling junction (MTJ) structure, the MTJ structure may be formed by patterning an MTJ layer by a directional etch, for example, a dry etch operation. During the operation of patterning the MTJ layer, top electrode of the MTJ structure may often be used as a masking layer for the patterning operation, and a sidewall of the top electrode is subject to physical bombardment of the directional etch. Consequently, conductive material of the top electrode may be sputtered and deposited on a sidewall of the as-patterned MTJ and/or magnetic/conductive materials of the MTJ layers may be sputtered and deposited on the sidewall of the top electrode. As a result, device short may be induced. Specifically, the aforesaid magnetic/conductive materials deposited at the undesired location form conductive residues which establish a conductive path on the sidewall of the MTJ and the sidewall of the top electrode. As such, electric and magnetic properties of the MTJ may not be effectively controlled by tunneling effect, thus deteriorating device performance.

The present disclosure provides semiconductor structures and the fabrication methods thereof, wherein a first dielectric layer is formed on a sidewall of the top electrode prior to patterning the MTJ layer. The risk of device short induced by conductive residue may be alleviated by hindering the formation of a conductive path connecting the sidewall of the MTJ and the sidewall of the top electrode.

Referring to FIG. 1, FIG. 1 is a cross sectional view of a semiconductor structure, according to some embodiments of the present disclosure. A semiconductor structure 1 at least includes a substrate 200 and a memory cell 100 above the substrate 200 (The details of the memory cell will be subsequently discussed in FIG. 2A and FIG. 2B). In some embodiments, the substrate 200 is a p-type semiconductor substrate (P-Substrate) or an n-type semiconductor substrate (N-Substrate) comprising silicon. In some other alternative embodiments, the substrate 200 includes other elementary semiconductor, such as germanium; a compound semiconductor including silicon carbide, gallium arsenic, gallium phosphide, indium phosphide, indium arsenide, and/or indium antimonide; an alloy semiconductor including silicon germanium (SiGe), gallium arsenide phosphide (GaAsP), aluminum indium arsenide (AlInAs), aluminum gallium arsenide (AlGaAs), indium gallium arsenide (InGaAs), indium gallium phosphide (InGaP), indium gallium arsenide phosphide (InGaAsP), combinations thereof, or the like. In some other embodiments, the substrate 200 is a semiconductor on insulator (SOI). In some other embodiments, the substrate 200 may include a doped epitaxial layer, a gradient semiconductor layer, and/or a semiconductor layer overlying another different type semiconductor layer, such as a silicon layer on a silicon germanium layer. The substrate 200 may or may not include doped regions, such as a p-well, an n-well, or combination thereof.

The semiconductor structure 1 includes a memory region 110A and a periphery region 110B. In some embodiments, the memory region 110A may include a memory cell 100, such as a magnetoresistive random access memory (MRAM) cell. The periphery region 110B may include logic components, a plurality of conductive lines or metal lines, wherein the plurality of conductive lines may provide routing for the plurality of memory cells 100. The memory region 110A and the periphery region 110B may be disposed in different regions on the substrate 200. For example, the periphery region 110B may be adjacent to the memory region 110A, or the memory region 110A may be surrounded by the periphery region 110B. However, such an example is not intended to be limiting. Other arrangements of the memory region 110A and the periphery region 110B also fall within the contemplated scope of the present disclosure.

In some embodiments, a transistor structure 201 in the memory region 110A and the periphery region 110B may be disposed in the same semiconductor substrate 200 and be fabricated in a front-end-of-line (FEOL) operation, and thus are substantially identical. In the memory region 110A, a transistor structure 201 may be disposed under the memory cell 100. In some embodiments, the memory cell 100 is embedded in a metallization layer prepared in a back-end-of-line (BEOL) operation. The memory cell 100 can be embedded in any position of the metallization layer, for example, between adjacent metal line layers extending in parallel over the substrate 200. In some embodiments, the embedded memory cell 100 can be located between an $N^{th}$ metal layer 102 and an $(N+1)^{th}$ metal layer 104 in the memory region 100A, wherein N is an integer greater than or equal to 1. In the logic region 100B, the $N^{th}$ metal layer 102 is connected to the $(N+1)^{th}$ metal layer 104 through a metal via 129, which is located between the $N^{th}$ metal layer 102 and the $(N+1)^{th}$ metal layer 104. An $N^{th}$ metal line 101 is disposed in the $N^{th}$ metal layer 102. It should be noted that the architecture of the metal line layers is not limited thereto.

The substrate 200 further includes heavily doped regions, such as a drain region 203 and a source region 205. A gate 207 is positioned over a top surface of the substrate 200 and between the source region 205 and the drain region 203. In some embodiments, the gate 207 may be a word line gate, which may be a portion of a word line (not shown in FIG. 1). A plurality of contact plugs 208 are formed in an inter-layer dielectric (ILD) 209. In some embodiments, the ILD 209 is disposed on the substrate 200, and the contact plugs 208 may be positioned above the source region 205 and the drain region 203. The ILD 209 above the substrate 200 may be formed from a variety of dielectric materials and may, for example, be an oxide (e.g., germanium oxide), an oxynitride (e.g., gallium phosphide oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), or other suitable dielectric materials.

In some of the embodiments, the source region 205 is electrically connected to a source line 217 through a contact plug 208, and the drain region 203 is connected to the memory cell 100 through another contact plug 208, wherein the gate 207 is between the two contact plugs 208. In some embodiments, one or more metal layer is between the memory cell 100 and the contact plug 208, wherein an interconnect feature 218 (which may include metal vias, vertical interconnects, horizontal interconnects) is electrically connecting the memory cell 100 and the contact plug 208 connected to the drain region 203. The interconnect feature 218 is disposed in an inter-metal dielectric (IMD) 110, wherein the IMD 110 is above the ILD 209.

In some embodiments, a plurality of shallow trench isolations (STI) 211 is formed in the substrate 200 in order to define and electrically isolate adjacent transistors, that is, to isolate a transistor electrically from neighboring semiconductor devices such as other transistors. In some embodiments, the memory region 110A and the periphery region 110B are defined by the STI 211. In some embodiments, one drain region 203 and one source region 205 are isolated by STI 211, that is, one memory cell 100 is connected to an area defined by the STI 211. In some other embodiments, two drain regions 203 and one source region 205 are isolated by STI 211 and two gates 207 are between source region 203 and each of the drain region 203. Herein two memory cells 100 are connected to an area defined by the STI 211. In some other embodiments, multiple drain regions 203 and multiple source regions 205 are isolated by STI 211, wherein the numbers of drain regions 203 and source regions 205 are not limited herein.

Figure 2A:
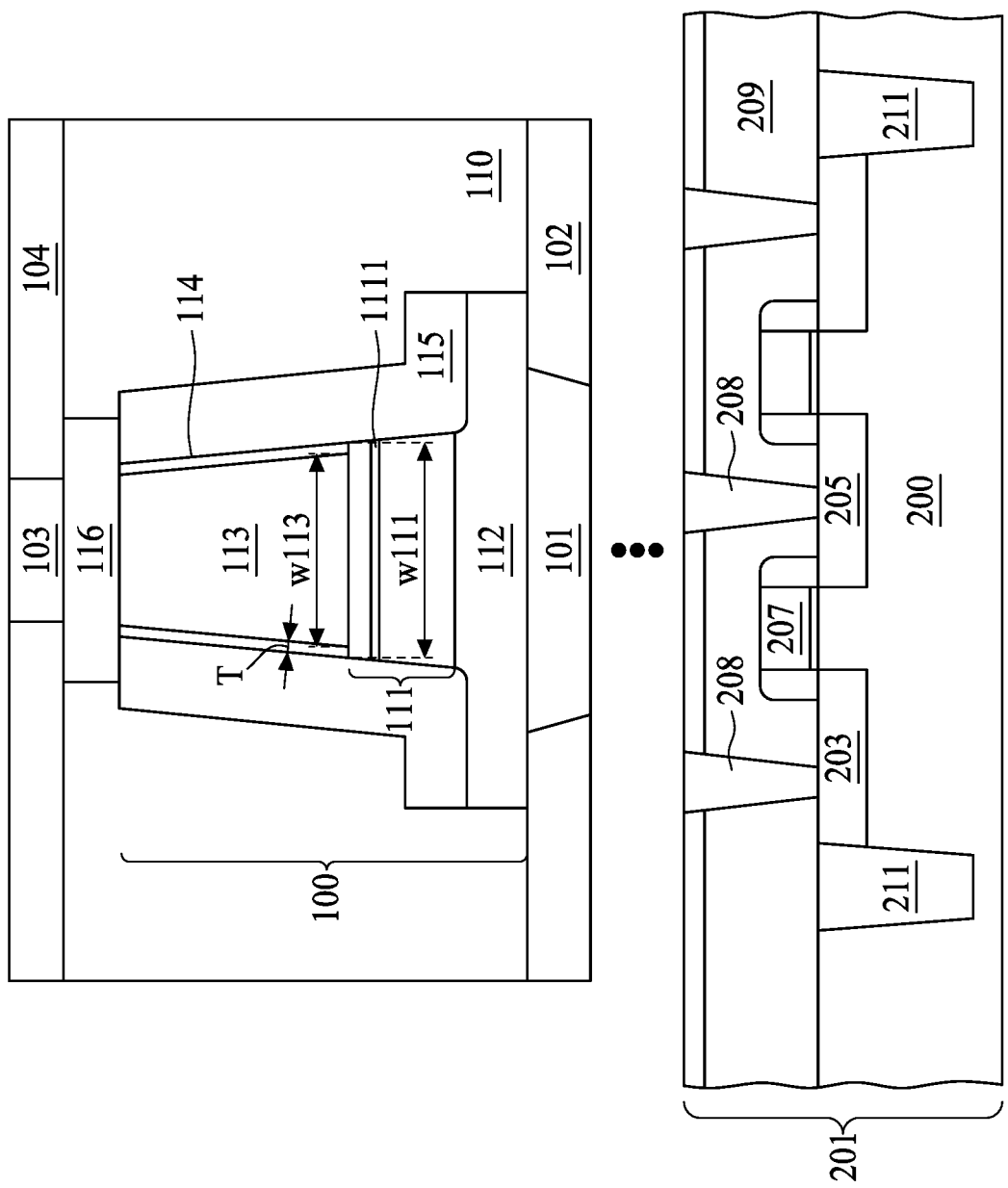
FIG. 2A is a cross sectional view of a semiconductor structure, according to some embodiments of the present disclosure.

Referring to FIG. 1 and FIG. 2A, FIG. 2A is a cross sectional view of a semiconductor structure, according to some embodiments of the present disclosure. It should be noted that since the memory cell 100 can be embedded in any position of the metallization layer, hereinafter a portion of the structures between the $N^{th}$ metal layer 102 and the ILD 209 (which includes interconnect feature 218, the IMD 110, and/or the source line 217) and the periphery region 110B are omitted for conciseness, and the structures between the $N^{th}$ metal layer 102 and the ILD 209 are represented by dots from FIG. 2A to FIG. 11. The memory cell 100 may include a bottom electrode 112, a magnetic tunneling junction (MTJ) 111, a top electrode 113, a first dielectric layer 114, and a second dielectric layer 115. The IMD 110 spaces between the $N^{th}$ metal layer 102 and the $(N+1)^{th}$ metal layer 104, and the memory cell 100 is surrounded by the IMD 110. The bottom electrode 112 is disposed above and electrically connected to the $N^{th}$ metal line 101. It is noteworthy that a bottom electrode 112 of a memory cell 100 and another bottom electrode 112 of an adjacent memory cell 100 are physically separated by the IMD 110.

The MTJ 111 is disposed above the bottom electrode 112. In some embodiments, the MTJ 111 may include ferromagnetic layers (which may include ferromagnetic material, which may be metal or metal alloy, for example, Fe, Co, Ni, CoFeB, FeB, CoFe, FePt, FePd, CoPt, CoPd, CoNi, TbFeCo, CrNi, TaN or the like), a capping layer (which may include non-ferromagnetic material, which may be a metal or an insulator, for example, Ag, Au, Cu, Ta, W, Mn, Pt, Pd, V, Cr, Nb, Mo, Tc, Ru, Ir, Re, Os, Be, Mg, Al, Ti, Ge, $Al_2O_3$, MgO, TaO, RuO or the like), and a spacer (which may include non-ferromagnetic metal, for example, Ag, Au, Cu, Ta, W, Mn, Pt, Pd, V, Cr, Nb, Mo, Tc, Ru or the like). The MTJ 111 may further include a tunnel barrier layer 1111, wherein the tunnel barrier layer may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Specifically, if a conductive path forms between the tunnel barrier layer 1111 and a sidewall of the top electrode 113, device short may be induced since the electric and magnetic properties of the MTJ 111 may not be effectively controlled by tunneling effect. In some embodiments, the MTJ 111 has a tapered shape tapering away from the bottom electrode 112. In some of the embodiments, a width of the bottom electrode 112 is greater than a width at a bottom surface of the MTJ 111, and a portion of the bottom electrode 112 extends outward from the MTJ 111.

The top electrode 113 is disposed above the MTJ 111, wherein the MTJ 111 is made from conductive material, and has a tapered shape tapering away from the bottom electrode 112. A width W111 of the MTJ 111 at the top surface is greater than a width W113 of the top electrode 113 at a bottom surface. A bit line 116 is disposed above the top electrode 113, and a conductive contact 103 is disposed above the bit line 116. The bit line 116, the top electrode 113, and the conductive contact 103 are electrically connected. The magnetization orientation of the memory cell 100 may be changed by supplying currents to the gate 107 (which can be a word line gate) and the bit line 116 crossing the memory cell 100, such as switching the magnetization orientation from parallel to anti-parallel or vice versa.

The first dielectric layer 114 is disposed above the MTJ 111, and the first dielectric layer 114 surrounds the top electrode 113. A bottom surface of the first dielectric layer 114 may directly contact a top surface of the MTJ 111. In some of the embodiments, an edge of the bottom surface of the first dielectric layer 114 may align with an edge of the top surface of the MTJ 111. A material of the first dielectric layer 114 may include tantalum oxide, titanium oxide, aluminum oxide, hafnium oxide, zirconium oxide, high-k dielectric material, combination thereof, or the like. A thickness T of the first dielectric layer 114 is in a range from about 0.5 nm to about 5.0 nm, wherein the properties of the material and the criticality of the thickness T of the first dielectric layer 114 will be subsequently discussed in FIG. 7 and FIG. 8.

The second dielectric layer 115 is disposed above a top surface of the bottom electrode 112, and further surrounds the MTJ 111 and the first dielectric layer 114. In some embodiments, the second dielectric layer 115 conformably surrounds the MTJ 111 and the first dielectric layer 114. The second dielectric layer 115 contacts the sidewall of the MTJ 111 and an outer sidewall of the first dielectric layer 114. The second dielectric layer 115 is surrounded by IMD 110. In some embodiments, a top surface of the second dielectric layer 115 is coplanar with a top surface of the top electrode 113. In some of the embodiments, a top surface of the second dielectric layer 115 is coplanar with a top surface of the first dielectric layer 114. A material of the second dielectric layer 115 may be an encapsulating material, such as silicon carbide (SiC), silicon nitride (SiN), silicon oxycarbide (SiOC), silicon oxynitride (SiON), silicon carbon nitride (SiCN), silicon oxide ($SiO_2$), the combination thereof, or other suitable material that can serve as an encapsulation layer. In some embodiments, a dielectric constant of the first dielectric layer 114 is greater than a dielectric constant of the second dielectric layer 115. In some embodiments, a thickness of the second dielectric layer 115 is greater than the thickness T of the first dielectric layer 114.

Figure 2B:
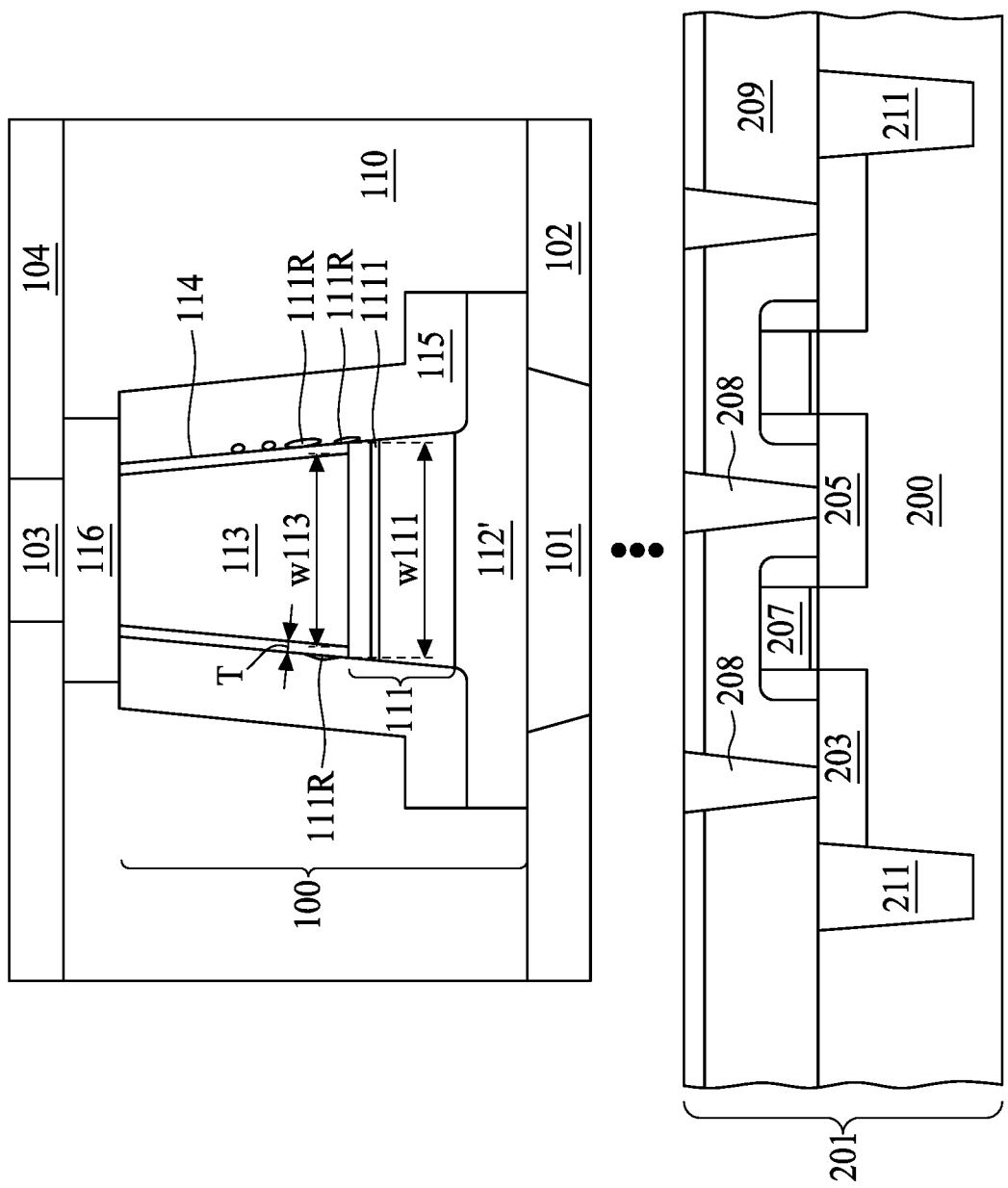
FIG. 2B is a cross sectional view of a semiconductor structure, according to some embodiments of the present disclosure.

Referring to FIG. 1 and FIG. 2B, FIG. 2B is a cross sectional view of a semiconductor structure, according to some embodiments of the present disclosure. Note that hereinafter elements in FIG. 2B to FIG. 12 being the same as or similar to aforesaid counterparts in FIG. 1 and FIG. 2A are denoted by the same reference numerals, as duplicated explanations are omitted. In some of the embodiments, the semiconductor structure 1 may further include MTJ residue 111R on a sidewall of the first dielectric layer 114. The MTJ residue 111R is between the first dielectric layer 114 and the second dielectric layer 115. The MTJ residue 111R includes a material identical to at least one of the material of the MTJ 111. The details of the MTJ residue 111R will be subsequently discussed from FIG. 7 to FIG. 10.

Figure 3A:
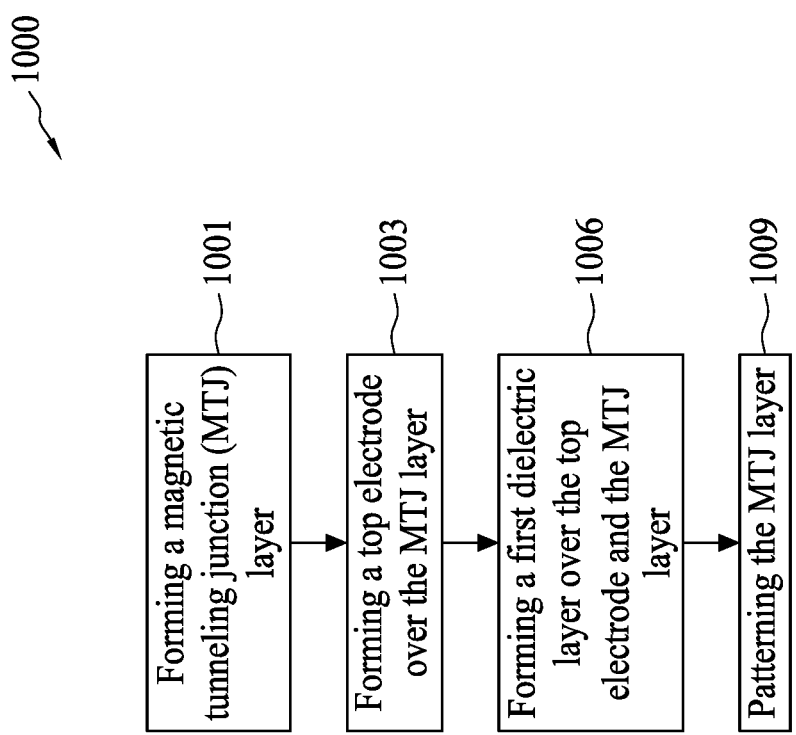
FIG. 3A shows a flow chart representing method of fabricating a semiconductor structure, in accordance with some embodiments of the present disclosure.

Referring to FIG. 3A, FIG. 3A shows a flow chart representing method of fabricating a semiconductor structure, in accordance with some embodiments of the present disclosure. The method 1000 for fabricating a semiconductor structure includes forming a magnetic tunneling junction (MTJ) layer (operation 1001, which can be referred to FIG. 4), forming a top electrode over the MTJ layer (operation 1003, which can be referred to FIG. 4 to FIG. 5), forming a first dielectric layer over the top electrode and the MTJ layer (operation 1006, which can be referred to FIG. 6 to FIG. 7), and patterning the MTJ layer (operation 1009, which can be referred to FIG. 8).

Figure 3B:
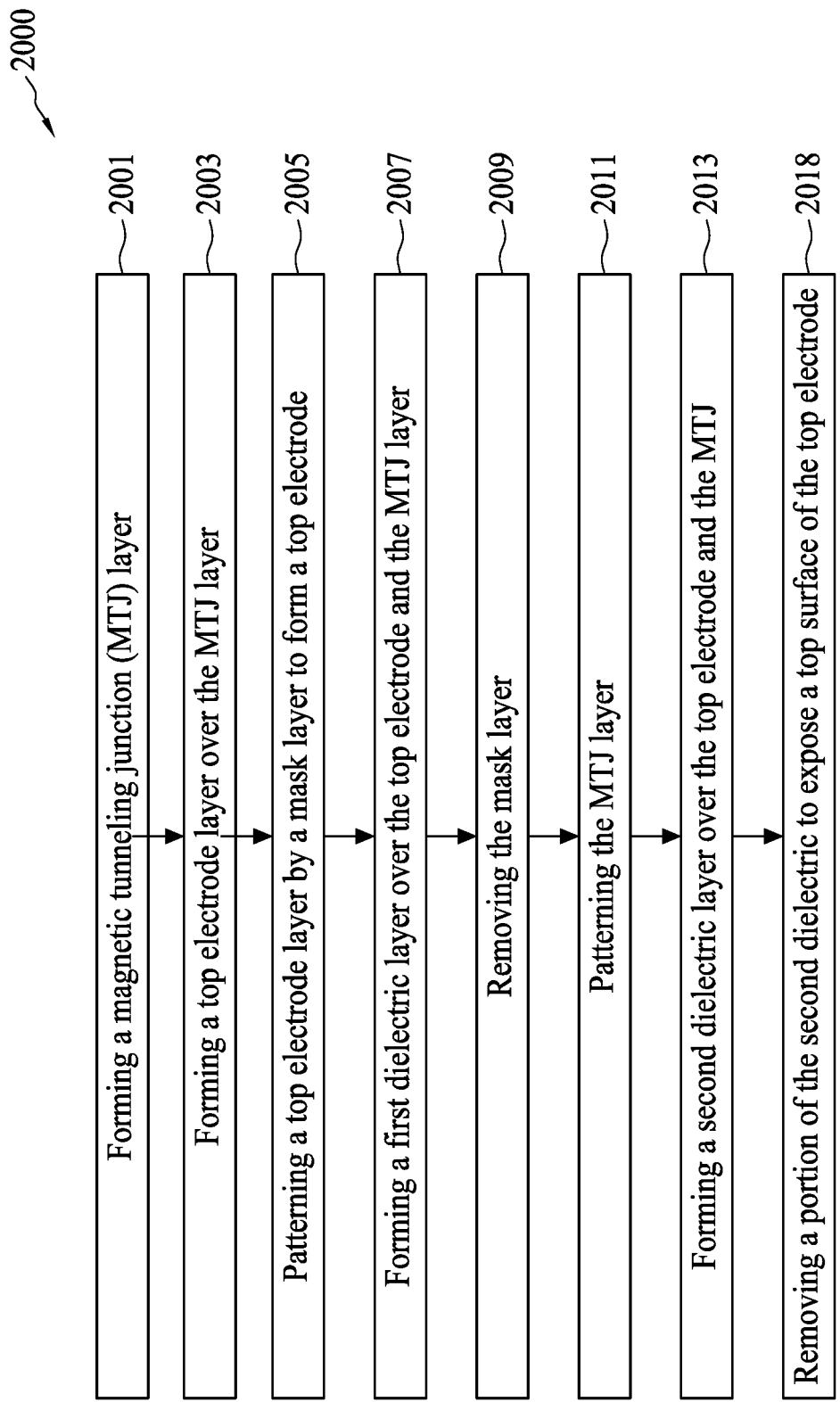
FIG. 3B shows a flow chart representing method of fabricating a semiconductor structure, in accordance with some embodiments of the present disclosure.

Referring to FIG. 3B, FIG. 3B shows a flow chart representing method of fabricating a semiconductor structure, in accordance with some embodiments of the present disclosure. The method 2000 for fabricating a semiconductor structure includes forming a magnetic tunneling junction (MTJ) layer (operation 2001, which can be referred to FIG. 4), forming a top electrode layer over the MTJ layer (operation 2003, which can be referred to FIG. 4), patterning a top electrode layer by a mask layer to form a top electrode (operation 2005, which can be referred to FIG. 5), forming a first dielectric layer over the top electrode and the MTJ layer (operation 2007, which can be referred to FIG. 6 to FIG. 7), removing the mask layer (operation 2009, which can be referred to FIG. 8), patterning the MTJ layer (operation 2011, which can be referred to FIG. 8), forming a second dielectric layer over the top electrode and the MTJ (operation 2013, which can be referred to FIG. 9), and removing a portion of the second dielectric to expose a top surface of the top electrode (operation 2018, which can be referred to FIG. 11).

Figure 4:
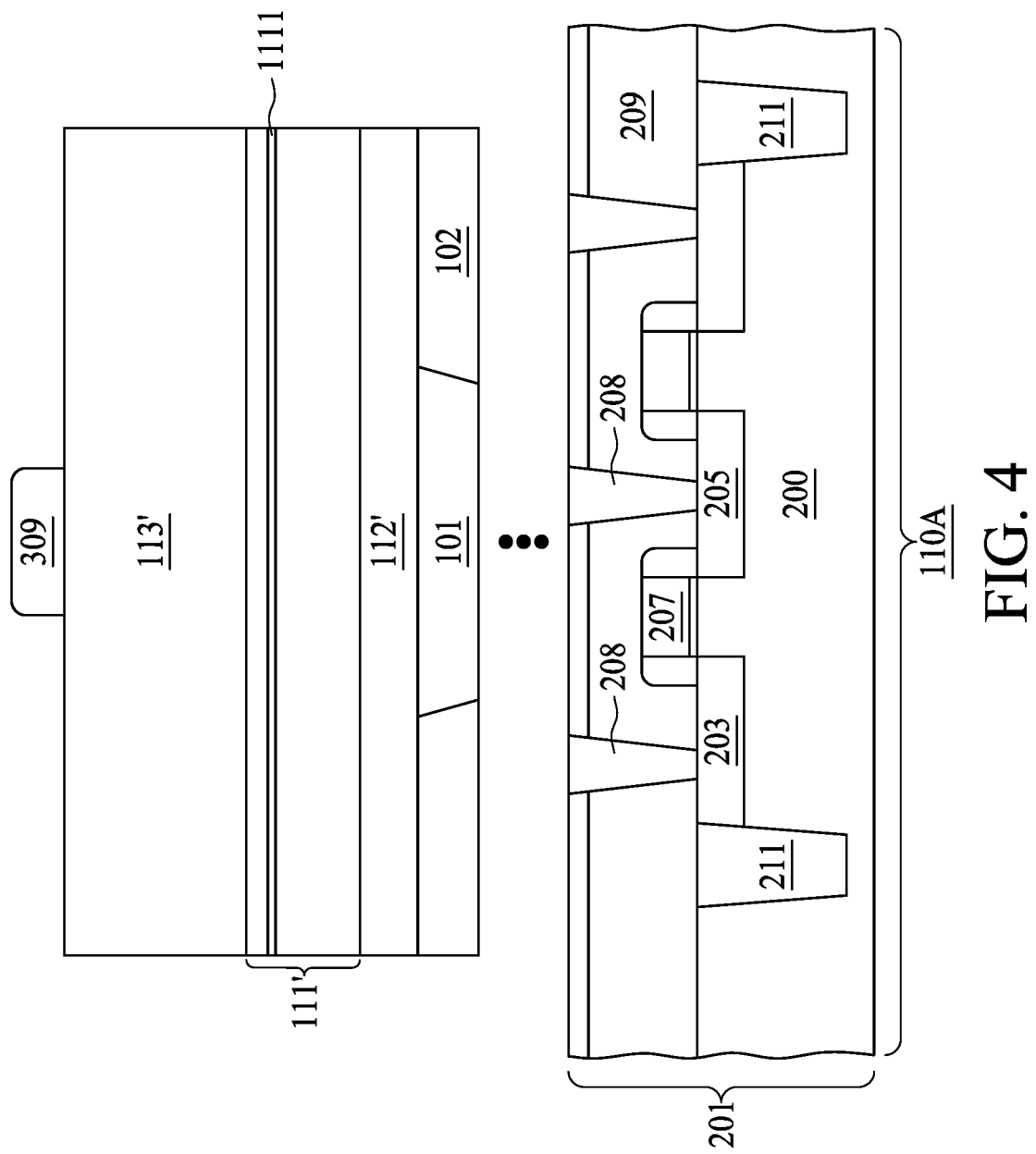
FIG. 4 to FIG. 8 are cross sectional views of a semiconductor structure during intermediate stages of manufacturing operations, according to some embodiments of the present disclosure.

Referring to FIG. 4, FIG. 4 is cross sectional view of a semiconductor structure during intermediate stages of manufacturing operations, according to some embodiments of the present disclosure. A substrate 200 as discussed in FIG. 1 is provided, wherein the transistor structure 201 is formed in the memory region 110A and the periphery region 110B of the substrate 200. The drain region 203 and the source region 205 are formed into the substrate 200 by doping, and the gate 207 is formed over a top surface of the substrate 200 and between the drain region 203 and the source region 205. The STI 211 is formed in the substrate 200 around the drain region 203 and the source region 205. The ILD 209 is formed on the substrate 200 and covers the drain region 203, the source region 205, and the gate 207. The ILD 209 may be formed by a variety of techniques for forming such layers, e.g., chemical vapor deposition (CVD), low-pressure CVD (LPCVD), plasma-enhanced CVD (PECVD), atomic layer deposition (ALD), sputtering and physical vapor deposition (PVD), thermal growing, or the like. A plurality of contact plugs 208 is formed in the ILD 209, wherein the contact plug 208 penetrates the ILD 209 and is connected to the drain region 203 and the source region 205.

Referring to FIG. 1 and FIG. 4, the source line 217 is formed above the ILD 209, wherein the source line 217 is connected to the source region 205 through a conductive contact plug 208. The IMD 110 is formed above the ILD 209, wherein IMD 110 may be formed by a variety of techniques for forming such layers, e.g., chemical vapor deposition (CVD), low-pressure CVD (LPCVD), plasma-enhanced CVD (PECVD), atomic layer deposition (ALD), sputtering and physical vapor deposition (PVD), thermal growing, or the like. At least one metal layer is formed in the IMD 110, for example, the $N^{th}$ metal layer 102 and the $(N+1)^{th}$ metal layer 104 is formed in the IMD 110 in the memory region 100A, and the memory cell 100 is formed between the $N^{th}$ metal layer 102 and the $(N+1)^{th}$ metal layer 104, wherein N is an integer greater than or equal to 1. The $N^{th}$ metal line 101 is disposed in the $N^{th}$ metal layer 102, and the memory cell 100 is electrically connected to the contact plug 208 through the interconnect feature 218 formed inside the IMD 110. Hereinafter a portion of the structures between the $N^{th}$ metal layer 102 and the ILD 209 (which includes interconnect feature 218, the IMD 110, and/or the source line 217) and the periphery region 110B are omitted for conciseness, and the structures between the $N^{th}$ metal layer 102 and the ILD 209 are represented by dots from FIG. 4 to FIG. 11.

Subsequently a bottom electrode layer 112' is formed above the $N^{th}$ metal layer 102 and the $N^{th}$ metal line 101, an MTJ layer 111' including the tunnel barrier layer 1111 is formed above the bottom electrode layer 112', a top electrode layer 113' is formed above the MTJ layer 111', and a mask layer 309 is formed above the top electrode layer 113'. The bottom electrode layer 112' and the top electrode layer 113' may be formed by various techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), atomic layer deposition (ALD), or the like.

In some embodiments, the MTJ layer 111' may include ferromagnetic layers (which may include ferromagnetic material, which may be metal or metal alloy, for example, Fe, Co, Ni, CoFeB, FeB, CoFe, FePt, FePd, CoPt, CoPd, CoNi, TbFeCo, CrNi, TaN or the like), a capping layer (which may include non-ferromagnetic material, which may be a metal or an insulator, for example, Ag, Au, Cu, Ta, W, Mn, Pt, Pd, V, Cr, Nb, Mo, Tc, Ru, Ir, Re, Os, Be, Mg, Al, Ti, Ge, $Al_2O_3$, MgO, TaO, RuO or the like), and a spacer layer (which may include non-ferromagnetic metal, for example, Ag, Au, Cu, Ta, W, Mn, Pt, Pd, V, Cr, Nb, Mo, Tc, Ru or the like). The MTJ layer 111' may further include a tunnel barrier layer 1111, wherein the tunnel barrier layer may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). The MTJ layer 111' may be formed by various techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), atomic layer deposition (ALD), or the like.

Figure 5:
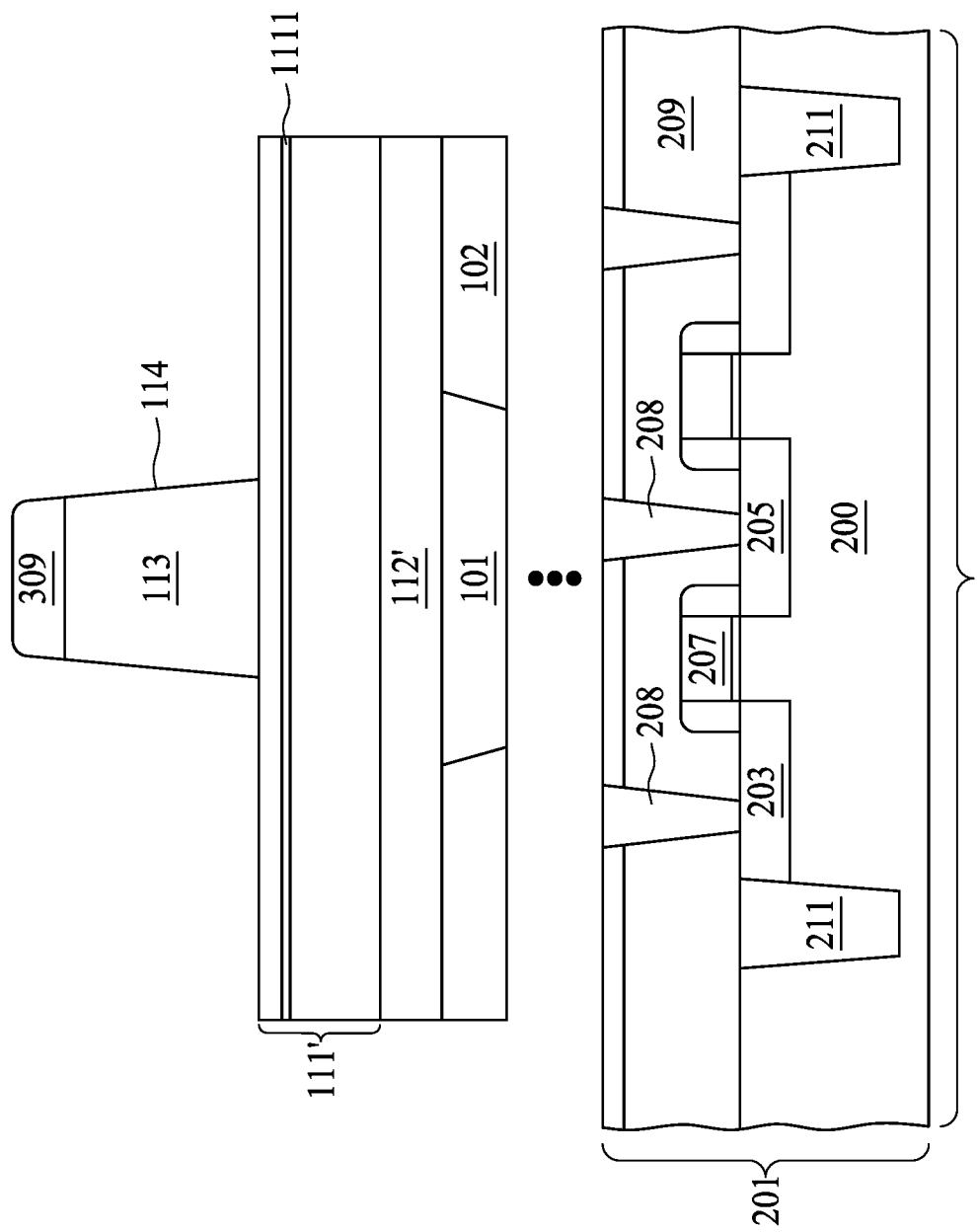

Referring to FIG. 5, FIG. 5 is cross sectional view of a semiconductor structure during intermediate stages of manufacturing operations, according to some embodiments of the present disclosure. By using the mask layer 309, the top electrode layer 113' is patterned by a lithography operation or etching operation, therefore the top electrode 113 is formed. In some embodiments, the top electrode 113 has a tapered shape tapering away from the MTJ layer 111'. A top surface of the MTJ layer 111' is exposed from the top electrode 113.

Figure 6:
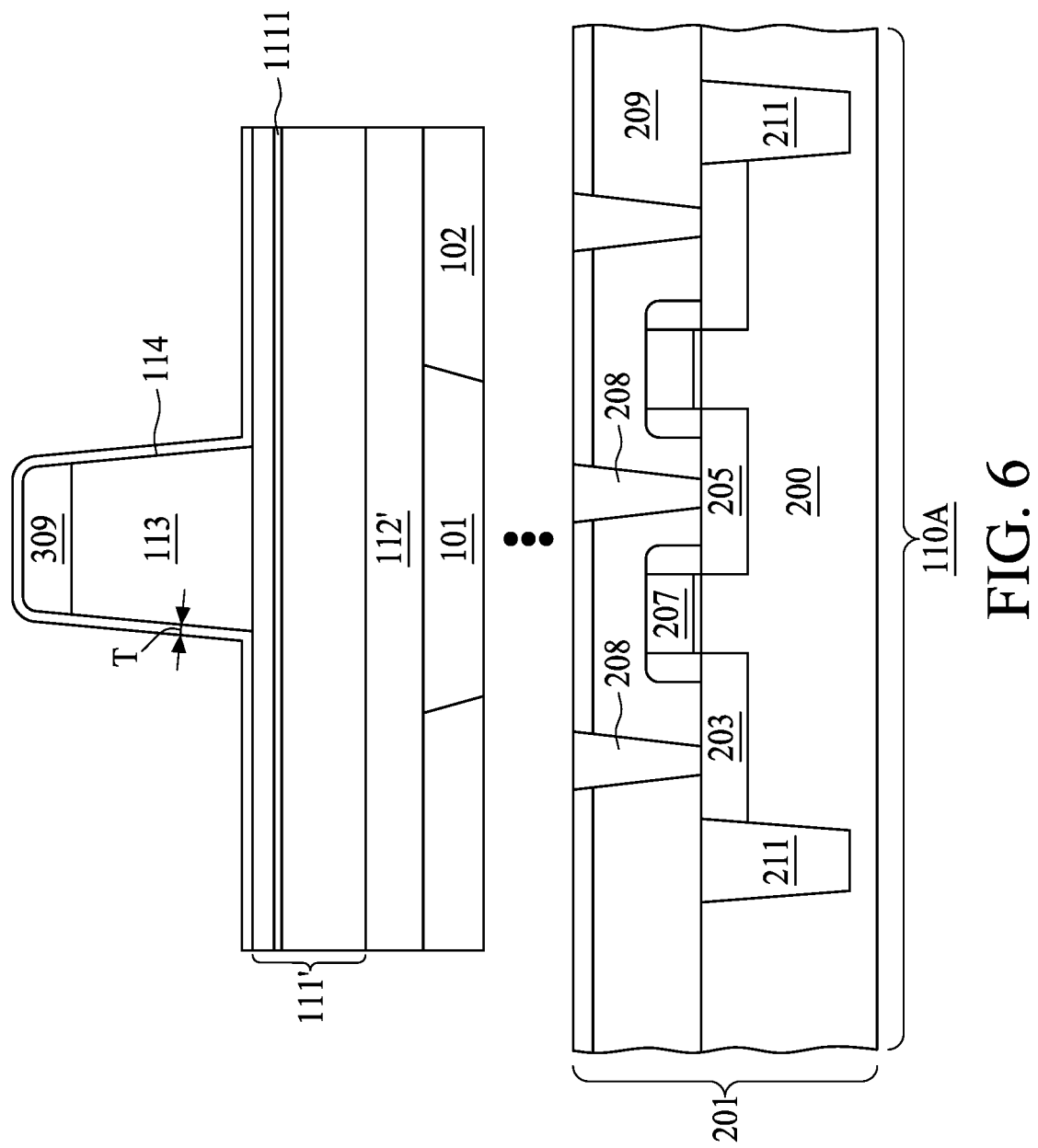

Referring to FIG. 6, FIG. 6 is cross sectional view of a semiconductor structure during intermediate stages of manufacturing operations, according to some embodiments of the present disclosure. A first dielectric layer 114 is conformably formed on a sidewall of the top electrode 113, a sidewall of the mask layer 309, a top surface of the mask layer 309, and a top surface of the MTJ layer 111'. A material of the first dielectric layer 114 may include tantalum oxide, titanium oxide, aluminum oxide, hafnium oxide, zirconium oxide, high-k dielectric material, combination thereof, or the like. The first dielectric layer 114 may be formed by various techniques, e.g., atomic layer deposition (ALD), sputtering, physical vapor deposition (PVD), chemical vapor deposition (CVD), or the like. A thickness T of the first dielectric layer 114 is in a range from about 0.5 nm to about 5.0 nm, wherein the properties of the material and the criticality of the thickness T of the first dielectric layer 114 will be subsequently discussed in FIG. 7 and FIG. 8.

Figure 7:
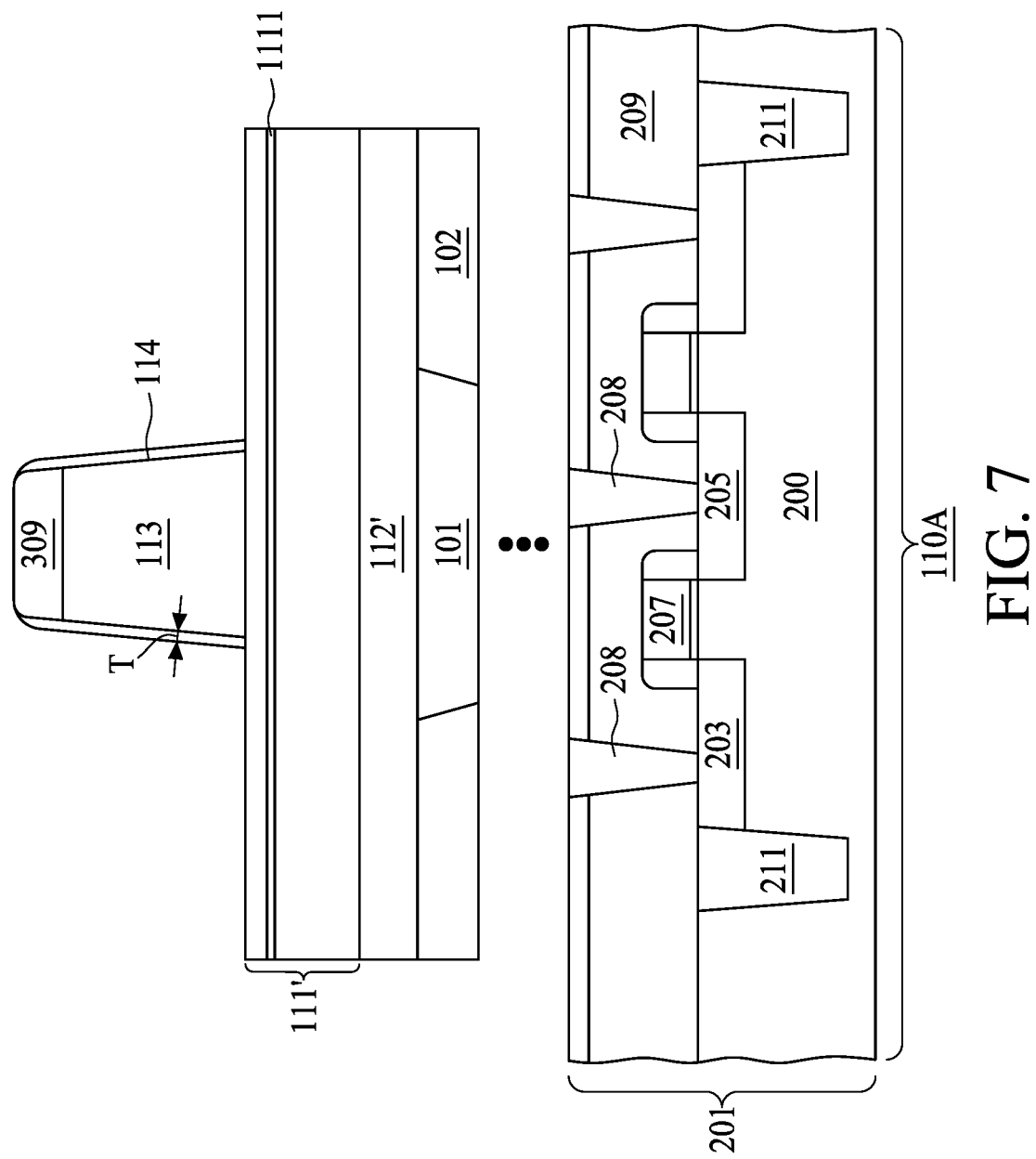

Referring to FIG. 7, FIG. 7 is cross sectional view of a semiconductor structure during intermediate stages of manufacturing operations, according to some embodiments of the present disclosure. Subsequently at least a portion of the first dielectric layer 114 above the mask layer 309 and at least a portion of the first dielectric layer 114 above the MTJ layer 111' is removed by a directional etch operation. In some embodiments after the directional etch, a top surface of the mask layer 309 and a top surface of the MTJ layer 111' are exposed from the first dielectric layer 114. In some embodiments, the thickness T of the first dielectric layer 114 may be less than 5 nm. If the thickness T of the first dielectric layer 114 is too thick, for example, greater than 5 nm, removing the portions of the first dielectric layer 114 above the mask layer 309 and the MTJ layer 111' may take greater etching duration or consume greater power if the etching operation is associated with plasma etch. If the thickness T of the first dielectric layer 114 is too thin, for example, less than 0.5 nm, the first dielectric layer 114 may not completely cover the sidewall of the top electrode 113 after the directional etch since a finite portion of the first dielectric layer 114 at the sidewall of the top electrode 113 may be consumed during the directional etch.

Figure 8:
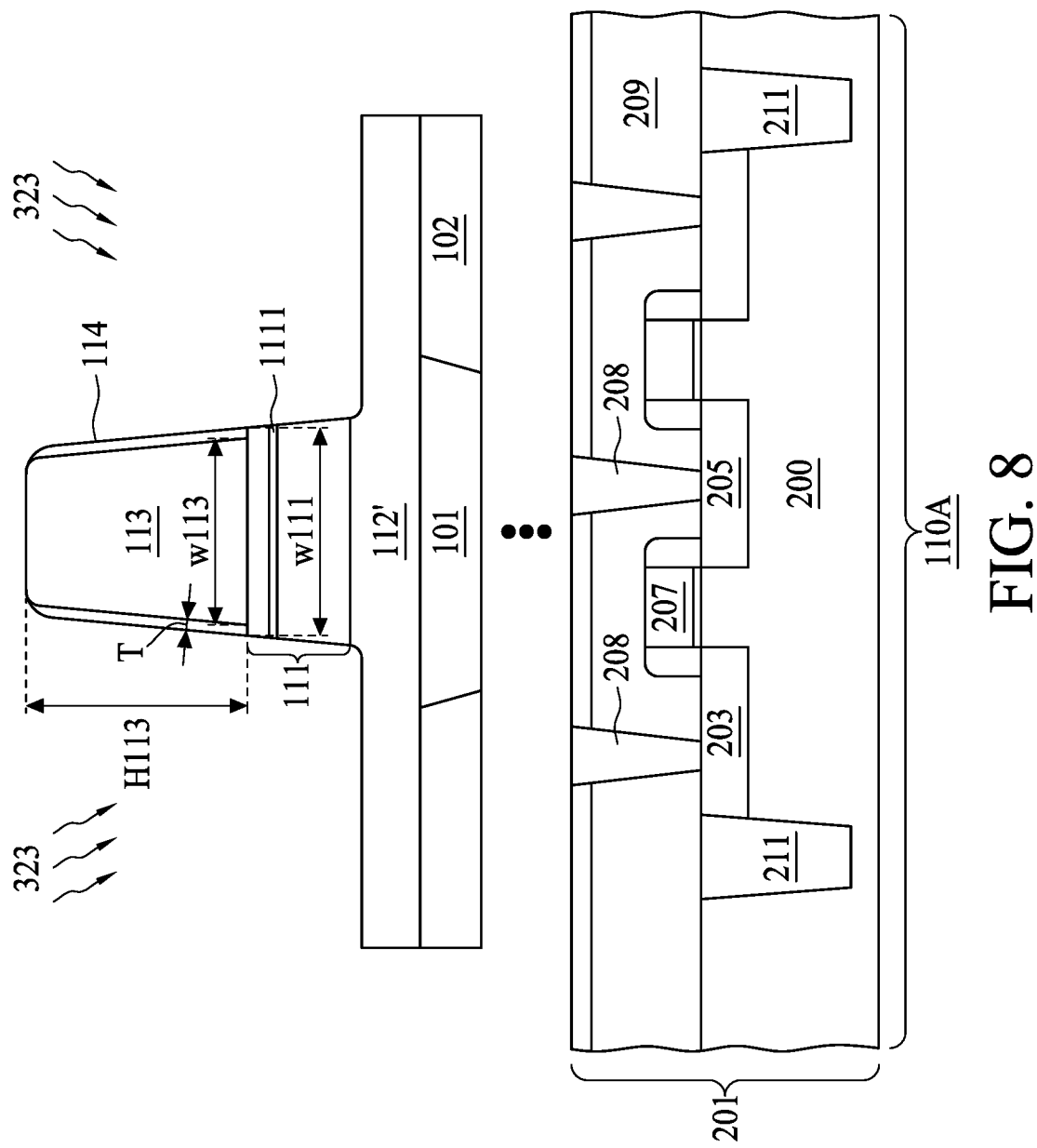
Figure 8A:
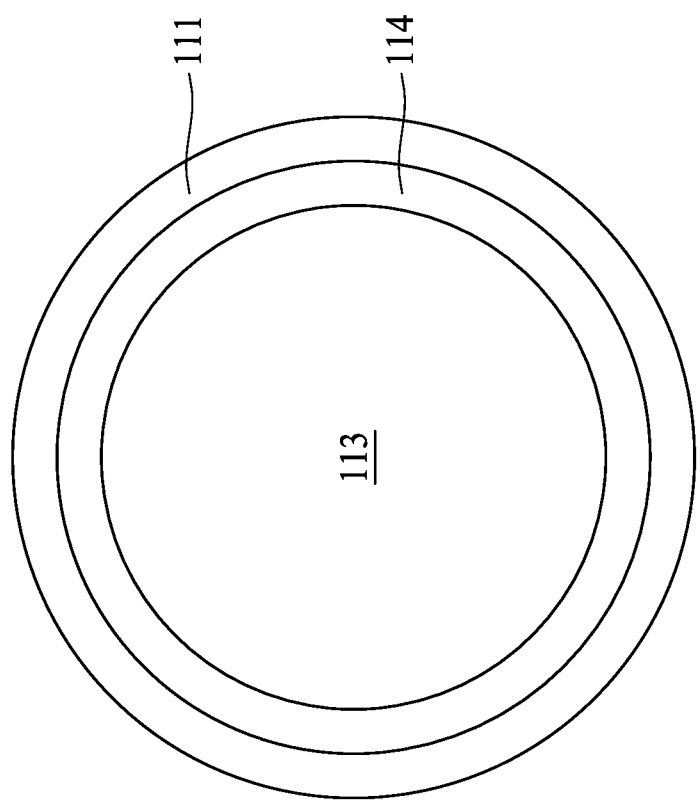
FIG. 8A is a schematic drawing illustrating a top perspective view of a top electrode, a first dielectric layer, and a magnetic tunneling junction (MTJ) during intermediate stages of manufacturing operations, according to some embodiments of the present disclosure.

Referring to FIG. 8 and FIG. 8A, FIG. 8 is cross sectional view of a semiconductor structure during intermediate stages of manufacturing operations, and FIG. 8A is a schematic drawing illustrating a top perspective view of a top electrode, a first dielectric layer, and a magnetic tunneling junction (MTJ) during intermediate stages of manufacturing operations, according to some embodiments of the present disclosure. Subsequently a portion of the MTJ layer 111' is removed by etching operation 323, e.g. by dry etching operation such as ion beam etch (IBE), to form the MTJ 111. Specifically, the material of the first dielectric layer 114 may include high-k dielectric material, tantalum oxide, titanium oxide, aluminum oxide, hafnium oxide, zirconium oxide, combination thereof, or the like, thus an etch rate of the first dielectric layer 114 under dry etching is substantially less than an etch rate of the MTJ layer 111' under dry etching. Thus the first dielectric layer 114 may hinder the sidewall of the top electrode 113 from being damaged by etching operation, and the risk of a material of the top electrode 113 being sputtered on the sidewall of the top electrode 113 and/or the MTJ 111 can be reduced due to the protection of the first dielectric layer 114. In some of the embodiments, the consumption of the first dielectric layer 114 during the etching operation 323 may be significantly less than the portion of the removed MTJ layer 111'. In some embodiments, the consumption of the first dielectric layer 114 during the etching operation 323 may be neglected in some cases, wherein the reduction of the thickness of the first dielectric layer 114 through the etching operation 323 may be neglected. In some embodiments, the dry etching is applied from a tilted angle, and the formed MTJ 111 may have a tapered shape tapering away from the bottom electrode 112.

Furthermore, while removing the portion of the MTJ layer 111' to form the MTJ 111, the mask layer 309 above the top electrode 113 is simultaneously removed by the etch operation 323. Therefore the etching from the top surface of the top electrode 113 can be delayed for a period of time and the etched amount from the top surface of the top electrode 113 can be reduced. In some of the embodiments, by such configuration of the first dielectric layer 114 and the mask layer 309, a height H113 of the top electrode 113 can be controlled with improved precision and an edge of the top surface of the top electrode 113 may have a corner similar to rounded fillet, thus reducing the defects caused by misalignment. Referring to FIG. 2A, FIG. 2B, and FIG. 8A, a top surface of the top electrode 113 may be similar to a rounded or circular shape from a top perspective view.

With regard to the thickness T of the first dielectric layer 114, the thickness T is in a range from about 0.5 nm to about 5 nm. If the thickness T is less than 0.5 nm, the first dielectric layer 114 may not effectively protect the sidewall of the top electrode 113 from the etching operation 323 before the etching on the MTJ layer 111' for forming MTJ 111 is finished, thus the sidewall of the top electrode 113 may be damaged. As previously discussed in FIG. 7, if the thickness T of the first dielectric layer 114 is greater than 5 nm, removing the portions of the first dielectric layer 114 above the mask layer 309 and above the MTJ layer 111' may take greater etching time or consume greater power if the etching operation includes dry etching. Furthermore, if a difference between the width W111 at the top surface of the MTJ 111 is greater than the width W113 of the top electrode 113 at a bottom surface by 5 nm, the difference of the resistivity between the MTJ 111 and the top electrode 113 may be too great, and the electric properties (such as conductivity) of the memory cell 100 may be affected.

By controlling the profile of the top electrode 113 and the MTJ 111 with improved precision and reducing the damage to the top electrode 113 by the etching operation, each of the fabricated memory cells 100 (shown in FIG. 1) may be closer to being aligned, and the yield may be improved. As a result, a bottom surface of the first dielectric layer 114 may directly contact with a top surface of the MTJ 111.

Figure 9:
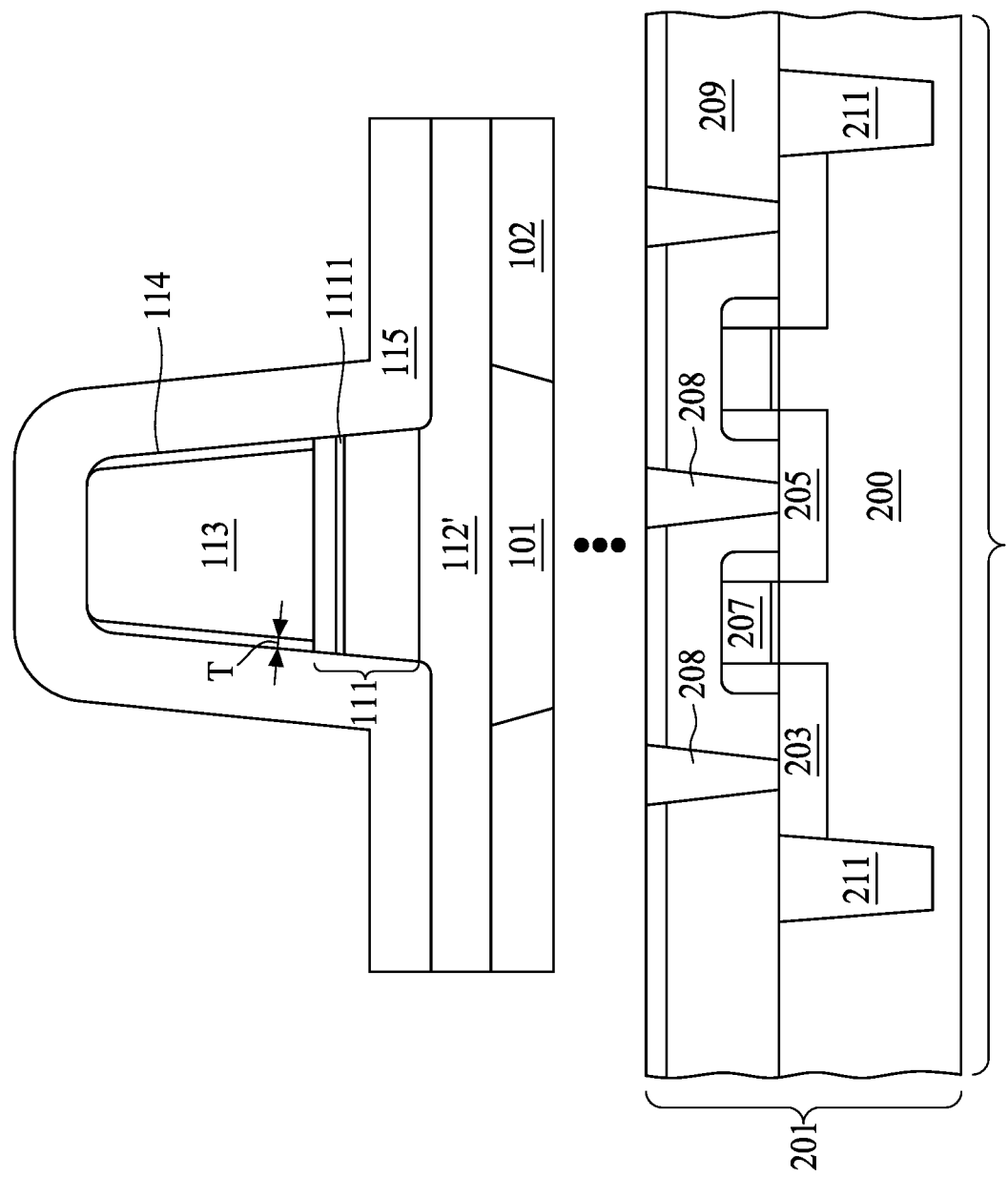
FIG. 9 to FIG. 12 are cross sectional views of a semiconductor structure during intermediate stages of manufacturing operations, according to some embodiments of the present disclosure.

Referring to FIG. 9, FIG. 9 is cross sectional view of a semiconductor structure during intermediate stages of manufacturing operations, according to some embodiments of the present disclosure. The second dielectric layer 115 is subsequently formed above a top surface of the bottom electrode 112, and further surrounds the MTJ 111 and the first dielectric layer 114 as an encapsulation layer to hinder the oxidation of the MTJ 111. In some embodiments, the second dielectric layer 115 conformably surrounds the MTJ 111 and the first dielectric layer 114. The second dielectric layer 115 contacts with the sidewall of the MTJ 111 and the outer sidewall of the first dielectric layer 114. A material of the second dielectric layer 115 may be an encapsulating material, such as silicon carbide (SiC), silicon nitride (SiN), silicon oxycarbide (SiOC), silicon oxynitride (SiON), silicon carbon nitride (SiCN), silicon oxide (SiO$_2$), the combination thereof, or other suitable material that can serve as an encapsulation layer. The second dielectric layer 115 may be formed by various techniques, e.g., atomic layer deposition (ALD), sputtering, physical vapor deposition (PVD), chemical vapor deposition (CVD), or the like. In some embodiments, a dielectric constant of the first dielectric layer 114 is greater than a dielectric constant of the second dielectric layer 115.

Figure 10:
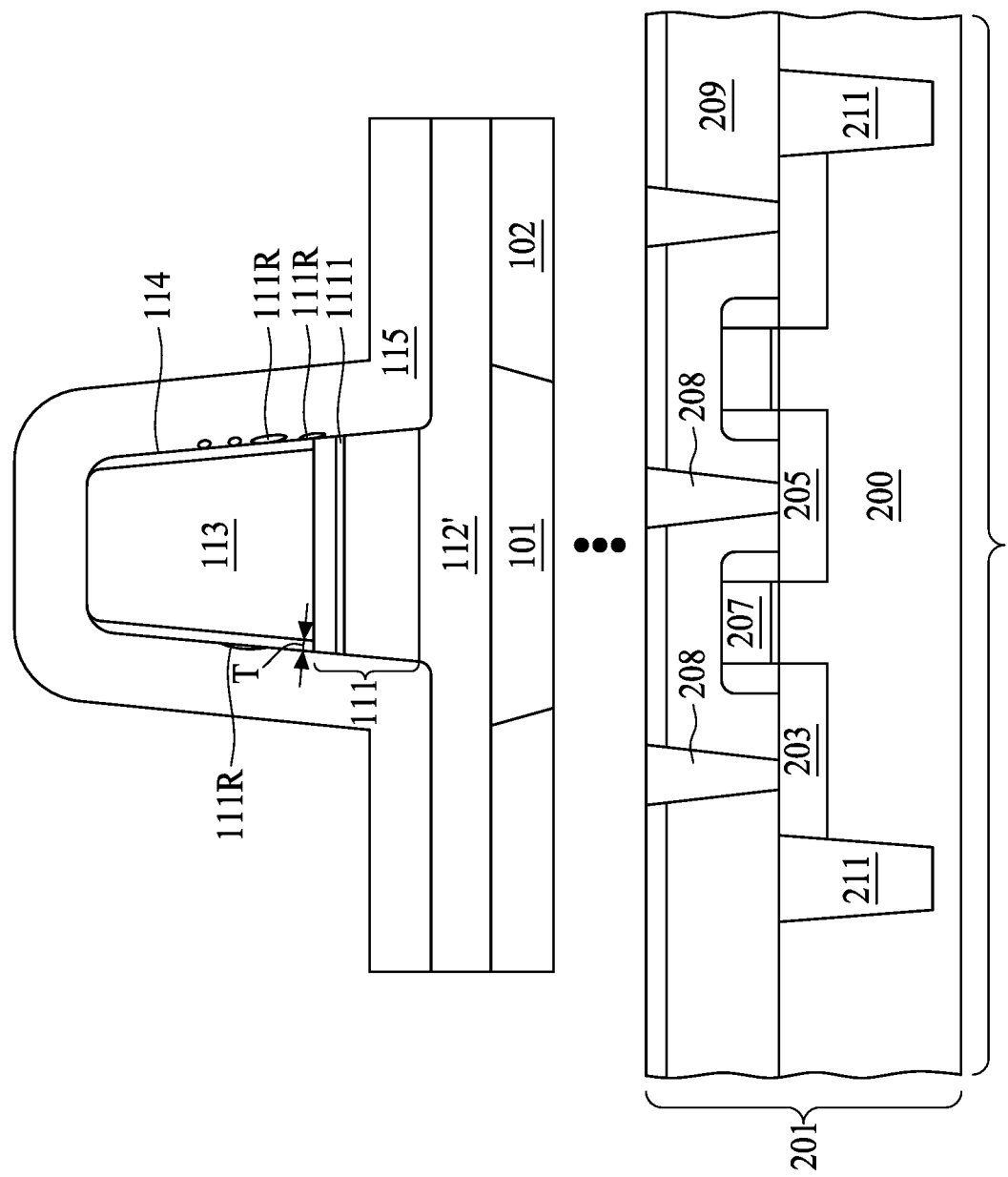

Referring to FIG. 10, FIG. 10 is cross sectional view of a semiconductor structure during intermediate stages of manufacturing operations, according to some embodiments of the present disclosure. In some embodiments, during the removal of the MTJ layer 111' by etching operation, a material of the MTJ layer 111' as discussed in FIG. 4 may be sputtered from the MTJ layer 111' and such MTJ residue 111R may be deposited on a sidewall of the first dielectric layer 114. Alternatively stated, the MTJ residue 111R may have at least one material identical to a material of the MTJ layer 111'. Thus subsequent to forming the second dielectric layer 115, the MTJ residue 111R may be between the first dielectric layer 114 and the second dielectric layer 115. Since the MTJ residue 111R is spaced away from the sidewall of the top electrode 113, the risk of inducing device short is reduced. In some embodiments, the MTJ residue 111R may be observed by various types of inspection techniques, such as energy-dispersive X-ray (EDX) spectroscopy, mass spectrometry, or other suitable inspection techniques. However the present disclosure is not limited thereto.

Figure 11:
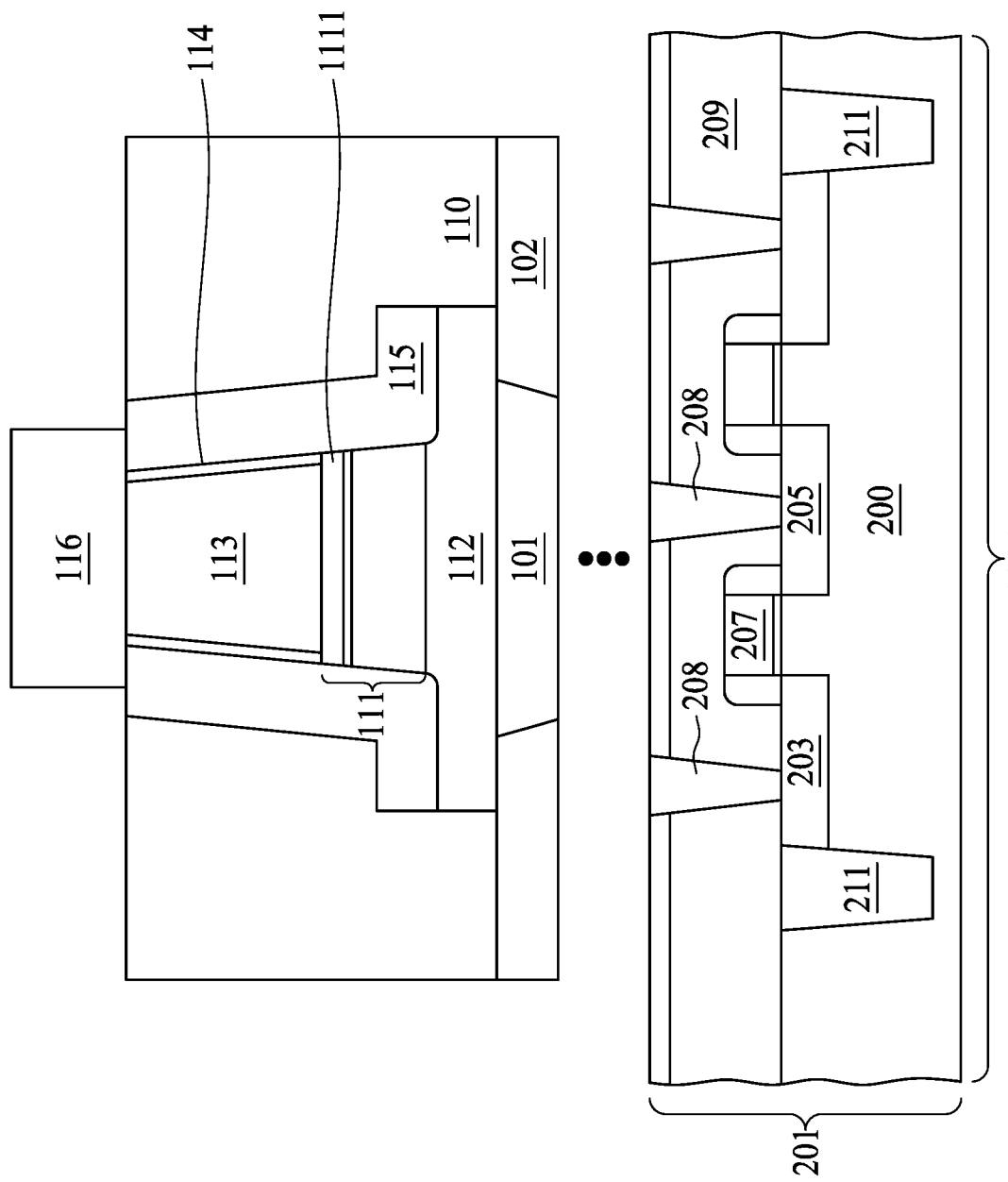

Referring to FIG. 11, FIG. 11 is cross sectional view of a semiconductor structure during intermediate stages of manufacturing operations, according to some embodiments of the present disclosure. Subsequently a portion of the second dielectric layer 115 above the $N^{th}$ metal layer 102 is removed and the bottom electrode layer 112' is patterned to form the bottom electrode 112, thus bottom electrodes 112 of adjacent memory cells 100 may be physically separated. Subsequently the IMD 110 is formed to surround the second dielectric layer 115 and a portion of the second dielectric layer 115 is removed to expose a top surface of the top electrode 113. In some embodiments, a planarization operation (such as chemical mechanical planarization operation) may be performed to expose a top surface of the top electrode 113. In some embodiments, a top portion of the top electrode 113 and a top portion of the first dielectric layer 114 are also removed. In some of the embodiments, the top surface of the top electrode 113 is coplanar with a top surface of the second dielectric layer 115 after the planarization operation. In some of the embodiments, the top surface of the top electrode 113 may be coplanar with a top surface of the first dielectric layer 114 after the planarization operation. Subsequently the bit line 116 is formed above the exposed top surface of the top electrode 113. The bit line 116 is in contact with the top electrode 113, the first dielectric layer 114, and the second dielectric layer 115.

Figure 12:
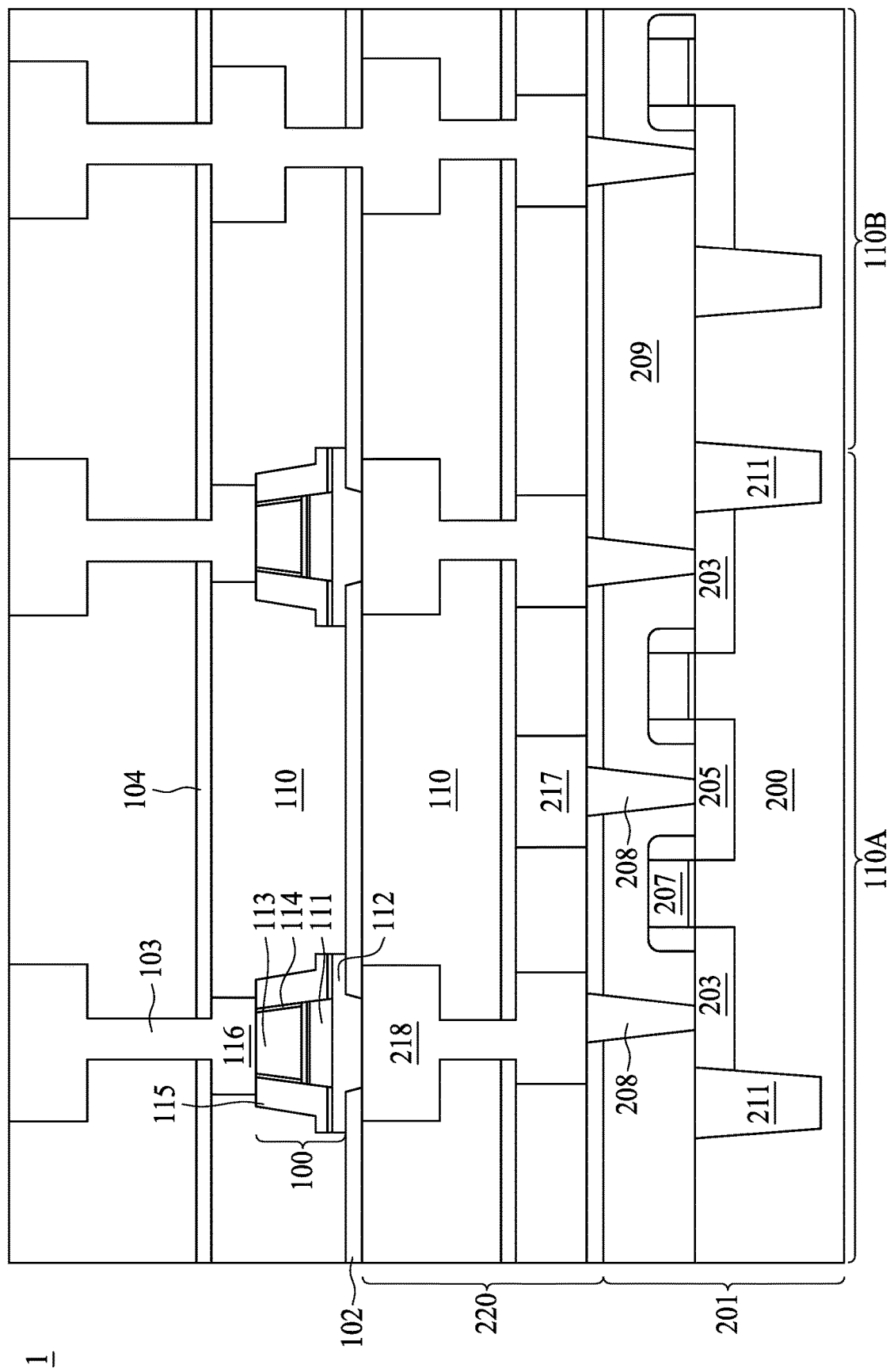

Referring to FIG. 12, FIG. 12 is cross sectional view of a semiconductor structure during intermediate stages of manufacturing operations, according to some embodiments of the present disclosure. Subsequently the conductive contact 103 is formed above the bit line 116, and the conductive contact 103 is electrically connected to the bit line 116 and the memory cell 100, thus the magnetization orientation of the memory cell 100 can be controlled.

The present disclosure provides a semiconductor structure and a method for fabricating a semiconductor structure. In order to reduce the risk of a material of the top electrode bombarded during etching operation and form a conductive path on the sidewall of the MTJ layer and the sidewall of the top electrode, a first dielectric layer is disposed on the sidewall of the top electrode before etching the MTJ layer. After the etching operation, a bottom surface of the first dielectric layer may directly contact with a top surface of the MTJ formed by etching operation. A thickness of the first dielectric layer is in a range from about 0.5 nm to about 5 nm, so that the first dielectric layer may effectively protect the sidewall of the top electrode from the etching operation, thus reducing the risk of a material of the top electrode being ejected and sputtered on the sidewall of the MTJ and the sidewall of the top electrode. In addition, a thickness of the first dielectric layer being less than 5 nm may reduce the time consumption and power consumption of removing the portions of the first dielectric layer 114 above the mask layer 309 and above the MTJ layer 111', and may reduce the risk of affecting the electrical properties of the memory cell due to the change of resistivity between the MTJ and the top electrode.

Furthermore, while removing the portion of the MTJ layer to form the MTJ, the mask layer above the top electrode may delay the etching from a top surface of the top electrode, thus the removed portion from the top surface of the top electrode can be reduced. By such configuration of the first dielectric layer and the mask layer, the profile of the top electrode can be controlled with improved precision, thus reducing the defects caused by misalignment.

Some embodiments of the present disclosure provide a semiconductor structure, including a magnetic tunneling junction (MTJ), a top electrode over a top surface of the MTJ, a first dielectric layer surrounding the top electrode, wherein a bottom surface of the first dielectric contacts with a top surface of the MTJ, and a second dielectric layer surrounding the first dielectric layer and the MTJ.

Some embodiments of the present disclosure provide a semiconductor structure, including a magnetic tunneling junction (MTJ), a top electrode over a top surface of the MTJ, wherein the top surface of the MTJ has an area greater than a bottom area of the top electrode, a high-k dielectric layer surrounding the top electrode, and an encapsulating layer surrounding the high-k dielectric layer and the MTJ.

Some embodiments of the present disclosure provide a method for fabricating a semiconductor structure, including forming a magnetic tunneling junction (MTJ) layer, forming a top electrode over the MTJ layer, forming a first dielectric layer over the top electrode and the MTJ layer, and patterning the MTJ layer to form an MTJ.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to

What is claimed:

1. A semiconductor structure, comprising:
a magnetic tunneling junction (MTJ), comprising a first ferromagnetic material;
a top electrode over a top surface of the MTJ;
a bottom electrode below a bottom surface of the MTJ;
a first dielectric layer surrounding the top electrode, wherein a bottom surface of the first dielectric contacts with a top surface of the MTJ;
a second dielectric layer surrounding the first dielectric layer and the MTJ, wherein the second dielectric layer is in direct contact with the bottom electrode; and
MTJ residue between the first dielectric layer and the second dielectric layer, wherein the MTJ residue is free from being in physical contact with a sidewall of the bottom electrode, the MTJ residue comprises the first ferromagnetic material.

2. The semiconductor structure of claim 1, wherein a thickness of the first dielectric layer is thinner than a thickness of the second dielectric layer.

3. The semiconductor structure of claim 1, wherein a dielectric constant of the first dielectric layer is greater than a dielectric constant of the second dielectric layer.

4. The semiconductor structure of claim 1, wherein a width of the top electrode at the bottom surface is less than a width of the top surface of the MTJ.

5. The semiconductor structure of claim 1, wherein the top surface of the second dielectric layer is coplanar with a top surface of the top electrode.

6. The semiconductor structure of claim 1, wherein a sidewall of the first dielectric layer and a sidewall of the MTJ contact with the second dielectric layer.

7. A semiconductor structure, comprising:
a magnetic tunneling junction (MTJ), comprising a tunnel barrier layer and a ferromagnetic layer overlapping with the tunnel barrier layer;
a top electrode over a top surface of the MTJ, wherein the top surface of the MTJ has an area greater than a bottom area of the top electrode;
a dielectric layer surrounding the top electrode;
an encapsulating layer surrounding the dielectric layer and the MTJ; and
residue comprising a material of the ferromagnetic layer, between the dielectric layer and the encapsulating layer, wherein a sidewall of the tunnel barrier layer is exposed from the dielectric layer, and at least a portion of the residue is at a level above a top surface of the tunnel barrier layer, wherein the residue is in direct contact with the encapsulating layer.

8. The semiconductor structure of claim 7, wherein the dielectric layer comprises at least one of the tantalum oxide, titanium oxide, aluminum oxide, hafnium oxide, and zirconium oxide.

9. The semiconductor structure of claim 7, wherein the encapsulating layer comprises at least one of the silicon carbide, silicon nitride, silicon oxycarbide, silicon oxynitride, silicon carbon nitride, and silicon oxide.

10. A semiconductor structure, comprising:
a metal line;
a magnetic tunneling junction (MTJ) above the metal line and comprising a first material;
a top electrode over a top surface of the MTJ;
a bottom electrode below a bottom surface of the MTJ and above the metal line;
a first dielectric layer surrounding the top electrode
a second dielectric layer surrounding the first dielectric layer, wherein a material of the first dielectric layer is different from a material of the second dielectric layer;
an insulation layer surrounding the second dielectric layer; and
residue comprising the first material, in a position between the first dielectric layer and the second dielectric layer, wherein the residue is free from being in physical contact with a sidewall of the bottom electrode, the first material is conductive.

11. The semiconductor structure of claim 10, wherein the residue is free from being in contact with the top electrode.

12. The semiconductor structure of claim 10, wherein the second dielectric layer spaces between the insulation layer and the residue.

13. The semiconductor structure of claim 10, wherein a sidewall of the MTJ is free from being in contact with the first dielectric layer.

14. The semiconductor structure of claim 10, wherein a sidewall of the MTJ is in direct contact with the second dielectric layer.

15. The semiconductor structure of claim 10, wherein a top surface of the top electrode is coplanar with a top surface of the second dielectric layer.

16. The semiconductor structure of claim 10, further comprising a bottom electrode under the MTJ, wherein a top surface of the bottom electrode is in direct contact with a bottom surface of the second dielectric layer.

17. The semiconductor structure of claim 16, wherein the first dielectric layer is free from being in contact with the bottom electrode.

18. The semiconductor structure of claim 10, at least a portion of the MTJ is free from being under a coverage of a vertical projection area of the first dielectric layer.

19. The semiconductor structure of claim 1, further comprising a bottom electrode under the MTJ, wherein the second dielectric layer is in direct contact with a top surface of the bottom electrode.

20. The semiconductor structure of claim 1, wherein a top surface of the first dielectric layer is coplanar with a top surface of the second dielectric layer.

* * * * *